United States Patent
Sagesaka et al.

(10) Patent No.: US 7,236,895 B2
(45) Date of Patent: Jun. 26, 2007

(54) ANALYSIS APPARATUS, ANALYSIS PROGRAM PRODUCT AND COMPUTER READABLE RECORDING MEDIUM HAVING ANALYSIS PROGRAM RECORDED THEREON

(75) Inventors: Hiroshi Sagesaka, Nara (JP); Tatsuroh Kiso, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/267,399

(22) Filed: Nov. 3, 2005

(65) Prior Publication Data
US 2006/0095218 A1     May 4, 2006

(30) Foreign Application Priority Data
Nov. 4, 2004    (JP)  ........................... 2004-321082

(51) Int. Cl.
    *G01R 15/00*     (2006.01)
    *G06F 19/00*     (2006.01)
    *G06F 17/50*     (2006.01)
(52) U.S. Cl. ............................. 702/57; 702/64; 716/4; 716/5
(58) Field of Classification Search ................. 702/57, 702/64, 65; 716/4, 6, 12, 15

See application file for complete search history.

(56) References Cited

U.S. PATENT DOCUMENTS

2005/0162148 A1*    7/2005   Staats ........................ 324/126

FOREIGN PATENT DOCUMENTS

JP     2003-223426     8/2003
JP     2004-054642     2/2004

OTHER PUBLICATIONS

Toru Uno; *"Finite Difference Time Domain Method for Electromagnetic Field and Antenna Analysis"* First Edition, Corona Publishing, Mar. 20, 1998; pp. 2-10 with English language translation.

\* cited by examiner

*Primary Examiner*—John Barlow
*Assistant Examiner*—Meagan S Walling
(74) *Attorney, Agent, or Firm*—David C. Conlin; David A. Tucker; Edwards Angell Palmer & Dodge LLP

(57) ABSTRACT

An analysis apparatus capable of analyzing a circuit even when the number of elements handled in a circuit analysis increases includes: a management unit receiving and dividing information into multiple pieces of information; a calculation unit calculating at least any one of a magnitude of an electric field and a magnitude of a magnetic field at a predetermined point of time for each of a circuit board and wiring; a conversion unit mutually converting at least any one of a magnitude of an electric field and a magnitude of a magnetic field and at least any one of a current value and a voltage value; and a circuit analysis unit calculating at least any one of a current value and a voltage value at a predetermined point of time for an element represented by any one of multiple pieces of information divided by the management unit.

9 Claims, 9 Drawing Sheets

ANALYSIS APPARATUS, ANALYSIS PROGRAM PRODUCT AND COMPUTER READABLE RECORDING MEDIUM HAVING ANALYSIS PROGRAM RECORDED THEREON

BACKGROUND OF THE INVENTION

1. Field of the Invention

The present invention relates to an analysis apparatus, an analysis program product, and a computer readable recording medium having an analysis program recorded thereon. More particularly, the present invention relates to an analysis apparatus, an analysis program product, and a computer readable recording medium having an analysis program recorded thereon, for obtaining a current value, a voltage value, an electric field intensity, and a magnetic field intensity, using Finite Difference Time Domain (hereinafter referred to as FDTD method) for differentiating and solving Maxwell differential equation with a time domain in cooperation with a circuit analysis typified by SPICE (Simulation Program with Integrated Circuit Emphasis developed by the University of California at Berkeley).

2. Description of the Background Art

The conventional analysis system includes a plurality of information processors connected through a network for processing divided regions to be analyzed in parallel, as disclosed in Japanese Patent Laying-Open No. 2004-054642. The analysis system includes at least two information processors for analyzing the divided region to be analyzed based on FDTD method in terms of an electric field and a magnetic field, and at least two information processors for analyzing an equivalent circuit of the divided region to be analyzed by means of a circuit simulation. The information processor for analyzing an electric field and a magnetic field includes a first arithmetic circuit operating at least one of the strength of an electric field and the strength of a magnetic field at a prescribed computational time in an overlap region, a transmission circuit transmitting at least one of the strength of an electric field and the strength of a magnetic field in the overlap region at a prescribed computational time to the information processor analyzing the adjacent region, and a second arithmetic circuit operating at least one of the strength of an electric field and the strength of a magnetic field at a computational time in a region other than the overlap region of the divided regions to be analyzed, in parallel with the transmission performed by the transmission circuit.

In this analysis system, it is assumed that an element analyzed by a circuit simulator is sufficiently small in size as compared with a wavelength and exists axially parallel in one cell. The Amère law expressed by formula (1) can be rewritten to formula (2) for an FDTD cell including an element.

$$\varepsilon \frac{dE}{dt} + J(E) = \nabla \times H \quad (1)$$

$$C \frac{dV}{dt} + I(V) = I \quad (2)$$

Here, V is a voltage applied to a chip, $C=\varepsilon A/\Delta z$ is the electrostatic capacity of the FDTD cell ($A=\Delta x \cdot \Delta y$ is a cell area of FDTD and $\Delta z$ is a height thereof), $I(V)$ ($=AJ(E)$) is current flowing in an element, and I is the entire cell current $A \cdot \nabla \times H^{n+1/2}$. In other words, the combination of the information processor analyzing based on FDTD method and the circuit simulator is expressed by a capacitor C, a constant-current source I, and an equivalent circuit of an element, which are connected in parallel. FIG. 9 shows the equivalent circuit thereof.

Data passing between the information processor analyzing based on FDTD method and the circuit simulator in the equivalent current source method will now be described. FIG. 10 is a data flow in the information processor analyzing based on FDTD method and the circuit simulator in time sequence.

Assume that electric field intensity $E^{n-1}$ at a time $(n-1)\Delta t_{em}$ and magnetic field intensity $H^{n-3/2}$ at a time $(n-\frac{3}{2})\Delta t_{em}$ are known. Magnetic field intensity $H^{n-1/2}$ at a time $(n-\frac{1}{2})\Delta t_{em}$ can be found by substituting $E^{n-1}$, $H^{n-3/2}$ into formula (4) described later. However, the electric field intensity $E^n$ at a time $n\Delta t_{em}$ is calculated differently between a cell including an element and a cell including no element. In a cell including no element, the electric field intensity $E^n$ is calculated by substituting $E^{n-1}$ and $H^{n-1/2}$ in formula (3) described later. In a cell including an element, the electric field intensity $E^n$ is calculated by a circuit analysis using a circuit simulator. The circuit simulator calculates electric field intensity $E^n$ by performing a circuit simulation from time $(n-1)\Delta t_{em}$ to time $n\Delta t_{em}$ (the time intervals are set finely enough) where an initial voltage value is $V^{n-1}=E_z^{n-1}\Delta z$ and an equivalent current source value is $I=A \cdot \nabla \times H^{n-1/2}$. The voltage value $V^n$ of an element at time $n\Delta t_{em}$ is converted into electric field intensity of a cell including an element, $E_z^n=V^n/\Delta z$, which is passed to the information processor analyzing based on FDTD method.

In the equivalent voltage source method, similarly, an equivalent voltage source value is obtained from an electric field obtained by FDTD method, and a current value at a time at which a magnetic field is obtained by FDTD method is analyzed by the circuit simulator, converted into a magnetic field, and then passed to the information processor analyzing based on FDTD method for further analysis.

The circuit simulator will be illustrated briefly. The circuit simulator is generally used as a tool for analyzing a transient state of an electric circuit including a nonlinear element. A library that covers a great number of subcircuits including integrated circuits is provided by manufactures, software companies, universities concerned, and the like. The analysis method in the circuit simulator is as follows. First, a current/voltage value at a node of a circuit to be analyzed is given as a variable, and Modified Nodal Analysis is adopted to a netlist on which information of connection between circuit elements and parameters of circuit elements are described, whereby nonlinear simultaneous differential equations are derived. These are converted into algebraic equations using a difference in a time domain and Newton iterative method. Those algebraic equations are solved to obtain the current/voltage value of the circuit at an analysis time. The transient state of voltage/current of the circuit is then obtained by advancing the difference time in the time domain and repeating the above calculation.

In the analysis using the method as described above (a method of analyzing electric field intensity, magnetic field intensity, and a circuit transient response in an analysis region including a nonlinear circuit element by a numerical simulation in which FDTD method and a circuit simulator cooperate with each other in a time domain. The method will be referred to as "the hybrid method" hereinafter), the electric field intensity and the magnetic field intensity in FDTD method are related to the current value and the voltage value in the circuit simulator.

Furthermore, Japanese Patent Laying-Open No. 2004-054642 describes a method of processing numerical calculations in parallel for the purpose of a fast analysis in which the hybrid method is expanded to a circuit analysis system configured with a plurality of information processors over a network.

In the following, the hybrid method in Japanese Patent Laying-Open No. 2004-054642 will be described with reference to FIG. 11. It is noted that FIG. 11 illustrates distribution of the hybrid-method processing for each information processor.

First, an analysis target including a circuit element is divided into a plurality of regions depending on the operation ability of a computer (1) and a computer (2) that conduct an analysis based on FDTD method, and is then allocated to the computers. In this example, the distribution to computer (1) and computer (2) is in the proportion of 5:4. In addition, an overlap region 130 is provided at the boundary of each region. An absorbing boundary region 132 is provided at the outer periphery of each region.

In each computer that conducts an electromagnetic field analysis, after the magnetic field intensity in each region is computed, the magnetic field intensity in overlap region 130 and then the electric field intensity in overlap region 130 are preferentially computed. The electric field intensity and the magnetic field intensity in overlap region 130 are transferred to the computer that analyzes the adjacent region based on FDTD method. Thereafter, the computations of the electric field intensity and then the magnetic field intensity in region (1) and region (2) are processed in parallel by computer (1) and computer (2). After the computation of the magnetic field intensity, the electric field intensity and the magnetic field intensity in overlap region 130 are received from the computer that has analyzed the adjacent region, so that the magnetic field intensity and then the electric field intensity at the next time are computed. Thereafter, the electromagnetic field analysis is performed repeatedly until a desired time.

Here, the circuit analysis for use in the hybrid method is also allocated to a computer (3) and a computer (4) for each region. The circuit analysis is performed in parallel with FDTD method in the following order. First, after the magnetic field intensity of overlap region 130 is computed, a constant-current value in the hybrid method is calculated from the magnetic field intensity on the periphery of an element (A) 134 and an element (B) 136. Then, the voltage values of element (A) 134 and element (B) 136 are calculated by solving circuit equations of respective regions in parallel. Then, the voltage values of element (A) 134 and element (B) 136 are converted into the electric field intensity (the electric field intensity in a cell including an element). Then, the electric field intensity is transferred to computer (1) and computer (2) that perform FDTD method. Thereafter, the operations are repeatedly performed in parallel by the computers as described above.

In accordance with this invention, the hybrid method is employed in the analysis system (configured with a plurality of information processors over a network), thereby achieving a higher speed.

An information processor according to Japanese Patent Laying-Open No. 2003-223426 analyzes an electric field and a magnetic field by FDTD method together with a plurality of other information processors, in which a region to be analyzed is divided. The information processor includes: first arithmetic unit operating at least one of the strength of an electric field and the strength of a magnetic field at a prescribed computational time in an overlap region of divided regions in which at least one of a plurality of other information processors individually analyzes an electric field or a magnetic field; a transmission controller controlling transmission of at least one of the strength of a magnetic field and the strength of an electric field in the overlap region at a computational time as operated by the first arithmetic unit to the other information processor analyzing the overlap region; and a second arithmetic unit operating at least one of the strength of an electric field and the strength of a magnetic field at a computational time in a region of the divided regions except the overlap region in parallel with the transmission controlled by the transmission controller.

In accordance with this invention, an electric field and a magnetic field can be analyzed by FDTD method more quickly using a plurality of information processors, without degradation in precision.

Toru Uno, "Finite Difference Time Domain Method for Electromagnetic Field and Antenna Analysis", the first edition, Corona Publishing, Mar. 20, 1998, pp. 2–10 (referred to as "Reference 1" hereinafter) discloses the hybrid method of simulating an electromagnetic wave radiating from electronic equipment using FDTD method. In accordance with this invention, an electromagnetic wave can be simulated more easily using a simple algorithm.

FDTD method will be described briefly with reference to FIG. 12. In FDTD method, when a structure such as a printed circuit board or a cavity of electronic equipment and the surrounding space are assumed as an analysis region, the analysis region is divided into minute cuboids called cells shown in FIG. 12. Here, each cell is given with magnetic permeability, permittivity, and conductivity according to the substance that forms the cell. The length of each side in the x, y, z direction is set as $\Delta x$, $\Delta y$, $\Delta z$, respectively.

Then, each component ($E_x$, $E_y$, $E_z$) of x, y, z of one of the electric field intensity E and the magnetic field intensity H as vector quantity (in the following description, the electric field intensity) is arranged on each side of the lattice of the cell. Each component ($H_x$, $H_y$, $H_z$) of x, y, z of the other (in the following description, the magnetic field intensity) is arranged vertically to the lattice face in the middle of the lattice face of the cell.

The following two formulas are obtained by using a central difference for time and space for the Maxwell differential equation.

$$E^n = \frac{1 - \frac{\sigma \Delta t}{2\varepsilon}}{1 + \frac{\sigma \Delta t}{2\varepsilon}} E^{n-1} + \frac{\frac{\Delta t}{\varepsilon}}{1 + \frac{\sigma \Delta t}{2\varepsilon}} \nabla \times E^{n-\frac{1}{2}} \quad (3)$$

$$E^{n+\frac{1}{2}} = E^{n-\frac{1}{2}} - \frac{\Delta t}{\mu} \nabla \times E^n \quad (4)$$

Here, $\sigma$, $\varepsilon$, $\mu$ indicate conductivity, permittivity, and magnetic permeability, respectively.

FIG. 13 shows the order in which the electric field intensity and the magnetic field intensity are calculated corresponding to the passage of time in FDTD method. Assume that a time interval is $\Delta t_{em}$, and the electric field intensity $E_{n-1}$ at a time $(n-1)\Delta t_{em}$ and the magnetic field intensity $H^{n-1/2}$ at a time $(n-\frac{1}{2})\Delta t_{em}$ are known. The electric field intensity $E^n$ at a time $n\Delta t_{em}$ is calculated by substituting $E^{n-1}$, $H^{n-1/2}$ into formula (3). Subsequently, the magnetic field intensity $H^{n+1/2}$ is calculated by substituting $E^n$, $H^{n-1/2}$ into formula (4) at a time $(n+\frac{1}{2})\Delta t_{em}$. In this manner, the electric field intensity E and the magnetic field intensity H are calculated alternately in time in FDTD method.

Here, time interval $\Delta t_{em}$ in FDTD method needs to satisfy the Courant stability condition shown in formula (5) for the size of a cell.

$$\Delta t_{em} \leq \frac{1}{c\sqrt{\left(\frac{1}{\Delta x}\right)^2 + \left(\frac{1}{\Delta y}\right)^2 + \left(\frac{1}{\Delta z}\right)^2}} \quad (5)$$

Here, c is the speed of light. It is generally known that when formula (5) is not satisfied for the time interval, the calculated value diverges.

Furthermore, when an open region is handled, reflection takes place at an external wall of an analysis region, causing an error. This problem is caused by that FDTD method is an analysis approach for a closed region. For this problem, a virtual boundary called an absorbing boundary needs to be provided in order to prevent reflection at an external wall of an analysis region. Reference 1 also introduces various absorbing boundary conditions that have been suggested so far.

In the invention disclosed in the aforementioned Japanese Patent Laying-Open No. 2004-054642, however, when the number of elements handled in the circuit analysis increases, the analysis target including a large number of circuit elements cannot be analyzed at high speed. This is because the time required for the circuit analysis increases. The invention disclosed in Japanese Patent Laying-Open No. 2003-223426 has also the similar problem. This problem will be described more specifically. The algebraic equation as converted in the course of the analysis using the circuit simulator is computed using a matrix operation. The order of this matrix becomes equal to the number of nodes of the circuit. Generally, when linear simultaneous equations with n unknowns are solved using a solution such as Gaussian elimination, the complexity is about $n^3/3 + O(n^2)$. As the scale of a circuit to be analyzed increases and the number of nodes increases, the complexity dramatically increases. This is the cause of an increase in analysis time. The increased analysis time also increases the computational cost.

In the invention disclosed in Reference 1, the computation time is almost determined by the operation speed of CPU (Central Processing Unit) and memory, irrespective of the number of elements, and high-speed analysis is not achieved.

SUMMARY OF THE INVENTION

The present invention is made to solve the aforementioned problems. An object of the present invention is to provide an analysis apparatus, an analysis program product, and a computer readable recording medium having an analysis program recorded thereon, in which even when the number of elements handled in a circuit analysis increases, a circuit can be analyzed at high speed.

In order to attain the object as described above, in accordance with an aspect of the present invention, an analysis apparatus includes: a reception unit for receiving information representing a property of a material forming a circuit board and wiring, information representing an arrangement of the material, information representing electric characteristics of a plurality of elements, and information representing a plurality of elements and the wiring linking a plurality of elements to each other; a first calculation unit for calculating a magnitude of an electric field and a magnitude of a magnetic field at a plurality of predetermined points of time for each of the circuit board and the wiring using a magnitude of an electric field and a magnitude of a magnetic field resulting from current and voltage in the element, the information representing a property, and the information representing an arrangement; a conversion unit for mutually converting a magnitude of an electric field and a magnitude of a magnetic field, and a current value and a voltage value; a division unit for dividing the information representing wiring linking a plurality of elements to each other into multiple pieces of element definition information representing wiring to which each element is linked; and a second calculation unit for calculating a current value and a voltage value at a plurality of predetermined points of time for an element represented by each of multiple pieces of element definition information divided by the division unit, using a current value and a voltage value converted by the conversion unit from a magnitude of an electric field and a magnitude of a magnetic field calculated by the first calculation unit, multiple pieces of element definition information divided by the division unit, and the information representing electric characteristics.

Specifically, the first calculation unit calculates a magnitude of an electric field and a magnitude of a magnetic field at a plurality of predetermined points of time for each of the circuit board and the wiring using a magnitude of an electric field and a magnitude of a magnetic field resulting from current and voltage in the element, the information representing a property, and the information representing an arrangement. The second calculation unit calculates a current value and a voltage value at a plurality of predetermined points of time for an element represented by each of multiple pieces of element definition information divided by the division unit, using a current value and a voltage value converted by the conversion unit from a magnitude of an electric field and a magnitude of a magnetic field calculated by the first calculation unit, multiple pieces of element definition information divided by the division unit, and the information representing electric characteristics. Therefore, multiple pieces of element definition information divided by the division unit is used to calculate a current value and a voltage value for an element represented by each of multiple pieces of element definition information divided by the division unit, so that a current value and a voltage value can be calculated at high speed even if the number of elements handled in circuit analysis increases. As a result, it is possible to provide an analysis apparatus capable of analyzing a circuit at high speed even if the number of elements handled in circuit analysis increases.

Preferably, the second calculation unit includes a part calculating the current value and the voltage value by Modified Nodal Analysis.

Preferably, the division unit includes a part dividing the information representing wiring linking a plurality of elements to each other into multiple pieces of element definition information such that multiple pieces of element definition information vary for each element.

Specifically, the division unit divides the information representing wiring linking a plurality of elements to each other into multiple pieces of element definition information such that multiple pieces of element definition information vary for each element. It is easy to divide the information into multiple pieces of element definition information such that they vary for each element. Therefore, it is possible to easily divide the information representing wiring linking a plurality of elements to each other into multiple pieces of element definition information representing wiring to which each element is linked. Since it is easy to divide the information representing wiring linking a plurality of elements to each other, it is possible to divide the information representing wiring linking a plurality of elements to each other by an apparatus having a simple structure. As a result, it is possible to provide an analysis apparatus capable of analyzing a circuit at high speed and having a simple structure even when the number of elements handled in circuit analysis increases.

Preferably, the part dividing the information representing wiring linking a plurality of elements to each other into multiple pieces of element definition information includes a part dividing the information representing wiring linking a plurality of elements to each other into multiple pieces of element definition information such that the information representing wiring linking a plurality of elements to each other includes information representing a position of the wiring whereby the information representing wiring linking a plurality of elements to each other varies for each element.

Specifically, the part dividing the information representing wiring linking a plurality of elements to each other into multiple pieces of element definition information divides the information representing wiring linking a plurality of elements to each other into multiple pieces of element definition information such that the information representing wiring linking a plurality of elements to each other includes information representing a position of the wiring whereby the information representing wiring linking a plurality of elements to each other varies for each element. Therefore, it is possible to more easily divide the information representing wiring linking a plurality of elements to each other into multiple pieces of element definition information. Since it is more easy to divide the information representing wiring linking a plurality of elements to each other, it is possible to divide the information representing wiring linking a plurality of elements to each other using an apparatus having a simpler structure. As a result, it is possible to provide an analysis apparatus capable of analyzing a circuit at high speed and having a simpler structure even when the number of elements handled in circuit analysis increases.

Preferably, the first calculation unit includes a part calculating the magnitude of an electric field and the magnitude of a magnetic field by Finite Difference Time Domain method.

Preferably, the second calculation unit includes: a determination unit determining whether or not Newton iterative method is used for an element represented by each of multiple pieces of element definition information; and a part calculating the current value and the voltage value using the Newton iterative method for an element that is determined by the determination unit to use the Newton iterative method.

Specifically, the part calculating a current value and a voltage value calculates a current value and a voltage value for an element determined by the determination unit to use Newton iterative method. Therefore, it is possible to calculate a current value and a voltage value at even higher speed. As a result, it is possible to provide an analysis apparatus capable of analyzing a circuit at even higher speed even when the number of elements handled in circuit analysis increases.

Preferably, the first calculation unit and the second calculation unit each include at least one separate computer.

In accordance with another aspect of the present invention, an analysis program product causes a computer to execute: a reception step of receiving information representing a property of a material forming a circuit board and wiring, information representing an arrangement of the material, information representing electric characteristics of a plurality of elements, and information representing a plurality of elements and the wiring linking the plurality of elements to each other; a first calculation step of calculating a magnitude of an electric field and a magnitude of a magnetic field at a plurality of predetermined points of time for each of the circuit board and the wiring using a magnitude of an electric field and a magnitude of a magnetic field resulting from current and voltage in the element, the information representing a property, and the information representing an arrangement; a conversion step of mutually converting a magnitude of an electric field and a magnitude of a magnetic field, and a current value and a voltage value; a division step of dividing the information representing wiring linking a plurality of elements to each other into multiple pieces of element definition information representing wiring to which each element is linked; and a second calculation step of calculating a current value and a voltage value at a plurality of predetermined points of time for an element represented by each of multiple pieces of element definition information divided at the division step, using a current value and a voltage value converted at the conversion step from a magnitude of an electric field and a magnitude of a magnetic field calculated at the first calculation step, multiple pieces of element definition information divided at the division step, and the information representing electric characteristics.

Specifically, it is possible to provide an analysis program product capable of analyzing a circuit at high speed even when the number of elements handled in circuit analysis increases.

In accordance with a further aspect of the present invention, a computer readable recording medium has an analysis program recorded thereon. The analysis program causes a computer to execute: a reception step of receiving information representing a property of a material forming a circuit board and wiring, information representing an arrangement of the material, information representing electric characteristics of a plurality of elements, and information representing a plurality of elements and the wiring linking a plurality of elements to each other; a first calculation step of calculating a magnitude of an electric field and a magnitude of a magnetic field at a plurality of predetermined points of time for each of the circuit board and the wiring using a magnitude of an electric field and a magnitude of a magnetic field resulting from current and voltage in the element, the information representing a property, and the information representing an arrangement; a conversion step of mutually converting a magnitude of an electric field and a magnitude of a magnetic field, and a current value and a voltage value; a division step of dividing the information representing wiring linking a plurality of elements to each other into multiple pieces of element definition information representing wiring to which each element is linked; and a second calculation step of calculating a current value and a voltage value at the plurality of predetermined points of time for an element represented by each of multiple pieces of element definition information divided at the division step, using a current value and a voltage value converted at the conversion step from a magnitude of an electric field and a magnitude of a magnetic field calculated at the first calculation step, multiple pieces of element definition information divided at the division step, and the information representing electric characteristics.

Specifically, it is possible to provide a computer readable recording medium having an analysis program recorded thereon for analyzing a circuit at high speed even when the number of elements handled in circuit analysis increases.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
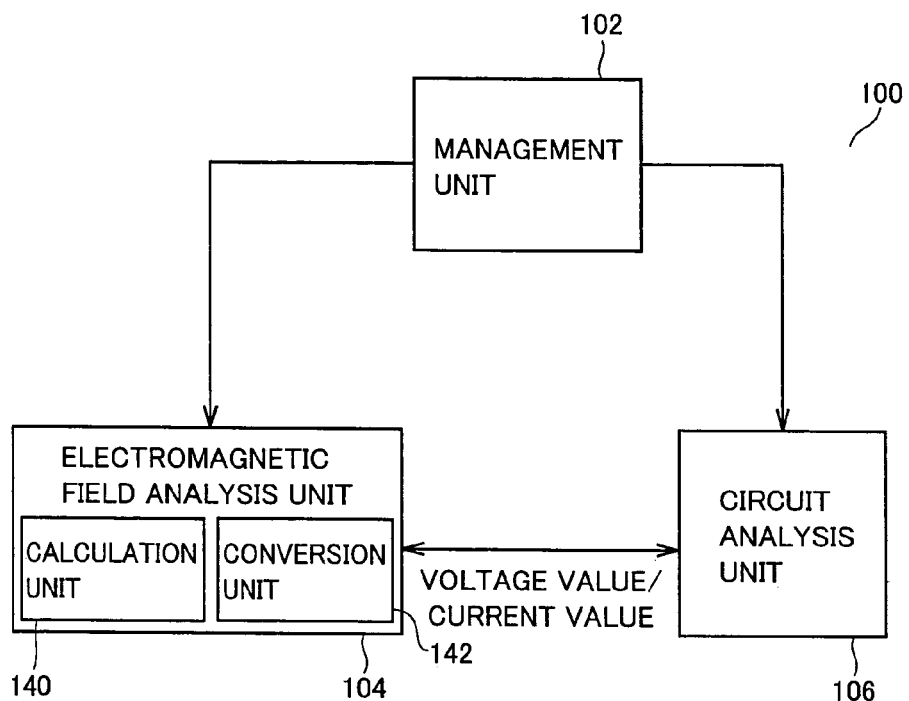
FIG. 1 is an overall configuration diagram of an analysis apparatus in accordance with an embodiment of the present invention.

In the following, an embodiment of the present invention will be described with reference to the figures. It is noted that in the following description the same components will be denoted with the same reference characters. Their names and functions are the same. Therefore, the detailed description thereof will not be repeated.

An analysis apparatus 100 in the present embodiment analyzes a circuit and an electromagnetic field in a cooperative manner based on circuit/electromagnetic field analysis cooperative information represented by physical structure information, information for circuit analysis (circuit analysis information), and arrangement information for each terminal. The physical structure information includes property information representing the property of materials (printed circuit boards, wiring, and the like) and arrangement information representing the arrangements of the materials. The circuit analysis information is a set of information in which an element name, information representing the electric characteristic of an element, and connection information of the element are associated with each other as a unit. The connection information is formed by associating a terminal existing in an element with a net name of the connected wiring. Thus, a plurality of elements and wiring linking a plurality of elements with each other are expressed.

Referring to FIG. 1, analysis apparatus 100 in the present embodiment includes a management unit 102, an electromagnetic field analysis unit 104, and a circuit analysis unit 106.

Management unit 102 breaks down a problem to be analyzed into an electromagnetic field analysis subproblem and a plurality of circuit analysis subproblems, which are distributed to electromagnetic field analysis unit 104 and circuit analysis unit 106, respectively. At this point, management unit 102 divides the connection information into multiple pieces of information in which a terminal existing in an element is associated with a net name of the connected wiring (in other words, an element and wiring to which an element links are represented). Thereafter, management unit 102 derives an appropriate synchronous time step from a parameter of each subproblem and initializes a loop counter. Then, control information is sent for each synchronous timing while the loop counter is incremented. The control information is information for performing cooperative processing and computation processing between electromagnetic field analysis unit 104 and circuit analysis unit 106. Here, in each loop, end determination is made using an abort time, a threshold value of internal energy, and the like as criteria for determination. In this manner, management unit 102 manages the progress of the entire analysis processing and computation processing. Management unit 102 also has a function of storing a part of information necessary for analysis. The information stored by management unit 102 is associated with a group called a "list". Management unit 102 efficiently processes information by associating the information with such a group. The "list" includes "unprocessed-element list", "connected-element list", and "cooperative net name list".

Electromagnetic field analysis unit 104 first performs cooperative processing such as a process of exchanging a voltage value or a current value with circuit analysis unit 106 based on the control information from management unit 102. Thereafter, the electromagnetic field analysis subproblem is computed until the synchronous timing specified by management unit 102 based on the control information from management unit 102. Here, the internal computation is performed using a unique time step and the computation is repeated until the specified synchronous timing is reached. In this way, electromagnetic field analysis unit 104 repeats the cooperative processing and the computation until the synchronous timing.

Circuit analysis unit 106 performs cooperative processing such as a process of exchanging a voltage value or a current value with electromagnetic field analysis unit 104 based on the control information from management unit 102. Then, a plurality of independent circuit analysis subproblem computations are carried out based on the control information from management unit 102. Thereafter, the computation proceeds for each of given circuit analysis subproblems using an independent time step. The computation proceeds until the synchronous timing is reached. It is noted that when the value of "independent time step" exceeds the aforementioned synchronous timing, the "independent time step" is adjusted such that a computational value at the synchronous timing is obtained. As described above, the computation proceeds until the synchronous timing for all the circuit analysis subproblems. In this manner, circuit analysis unit 106 repeats the computation of subproblems until synchronous timings and the cooperative processing.

Electromagnetic field analysis unit 104 includes a calculation unit 140 and a conversion unit 142. Calculation unit 140 calculates the magnitude of an electric field and the magnitude of a magnetic field at a predetermined point of time for each of a circuit board and wiring using either of a current value and a voltage value in an element, information representative of the property, and information representative of the arrangement. Conversion unit 142 mutually converts at least any one of the magnitude of an electric field and the magnitude of a magnetic field and at least any one of a current value and a voltage value.

Figure 2:
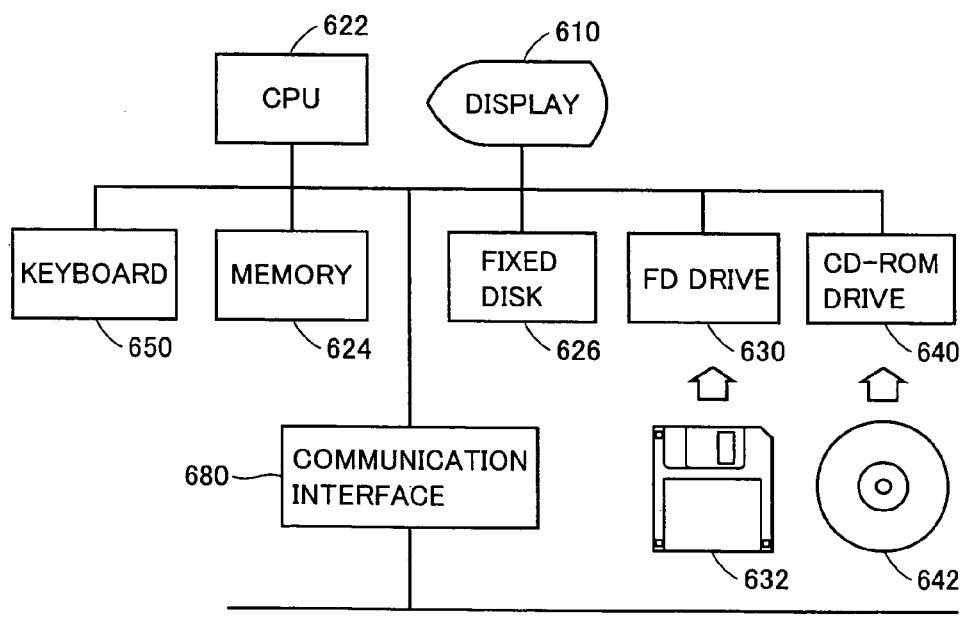
FIG. 2 is an overall configuration diagram of computer hardware that implements the analysis apparatus in accordance with the embodiment of the present invention.

The analysis apparatus 100 is implemented by computer hardware shown in FIG. 2 and software executed by CPU 622. Referring to FIG. 2, the above-noted computer hardware includes a display 610 formed of liquid crystal (display 610 may be a display formed of CRT (Cathode-Ray Tube). In the present embodiment, however, display 610 is formed of liquid crystal), a CPU 622 intensively managing and controlling the computer hardware itself, a memory 624 including an ROM (Read Only Memory) or an RAM (Random Access Memory), a fixed disk 626, an FD (Flexible Disk) drive 630 removably receiving an FD 632 for accessing the inserted FD 632, a CD-ROM (Compact Disk Read Only Memory) drive 640 removably receiving a CD-ROM 642 for accessing the inserted CD-ROM 642, a communication interface 680 connecting the computer hardware to a communication network for communications, and a keyboard 650 receiving inputs by keys. These components are communicated and connected to each other through buses. The computer hardware may include a magnetic tape device for accessing a cassette-type magnetic tap that is removably inserted. In the present embodiment, however, such a device is not provided. Such software is generally stored in a recording medium such as FD 632 or CD-ROM 642 for distribution, is read from the recording medium by FD drive 630 or CD-ROM drive 642, and is once stored in fixed disk 626. The software is then read into memory 624 and executed by the above-noted CPU 622. The hardware as described above is generally known per se. Therefore, the most essential part of the present invention is the software recorded in the recording medium such as FD 632 or CD-ROM 642.

Figure 3:
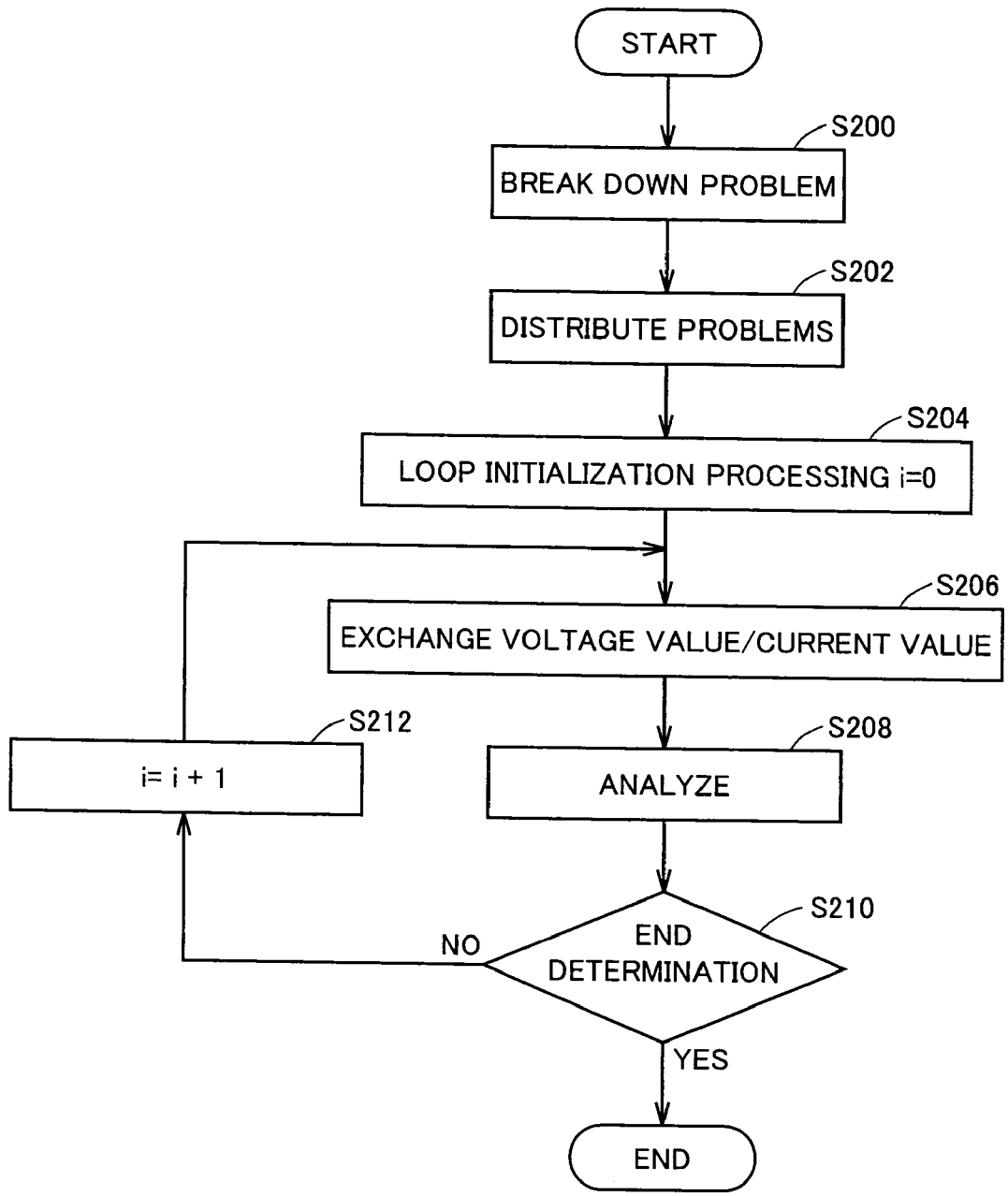
FIG. 3 is a flowchart showing a procedure of control of an analysis process of a circuit and an electric field and a magnetic field in accordance with the embodiment of the present invention.

Referring to FIG. 3, the program executed by analysis apparatus 100 relates to an analysis of a circuit and an electric field and a magnetic field and has the following control structure.

First, at step 200 (hereinafter a step is abbreviated as S), management unit 102 (actually, keyboard 650) receives physical structure information and circuit analysis information. More specifically, management unit 102 receives information representing the property of materials constituting a circuit board and wiring, information representing the arrangement of the materials, information representing the electric characteristics of a plurality of elements, and information representing a plurality of elements and wiring linking a plurality of elements to each other. Upon reception of the physical structure information and the circuit analysis information, management unit 102 (actually, CPU 622 and memory 624) generates an electromagnetic field analysis subproblem (a data table of information about a cell) based on the physical structure information through the following steps. At a first step, management unit 102 (actually, CPU 622) divides an electromagnetic field analysis region of a circuit to be analyzed into cells. In order to divide the electromagnetic field analysis region into cells, management unit 102 cuts the electromagnetic field analysis region into a mesh in x, y, z directions based on the arrangement information. In other words, management unit 102 (actually, CPU 622) creates a data table in which a number unique to each cell is associated with the coordinates in x, y, z directions of each cell (actually, memory 624 stores the created data table) so that the electromagnetic field analysis is performed by FDTD method. The algorithm for dividing the electromagnetic field analysis region into cells is not specifically limited. At a second step, management unit 102 (actually CPU 622) relates each cell to the property information of the substance present in each cell. Specifically, management unit 102 (actually CPU 622) modifies the data table created at the first step into a data table in which a number unique to each cell, the coordinates of each cell, and the property information of the substance present in each cell are associated with each other. The data table modified in this way is an electromagnetic field analysis subproblem in the present embodiment. Here, management unit 102 (actually CPU 622) determines whether or not each cell satisfies the following rules. The first rule is that an element with the same net name with arrangement information (described later) is not included in the same cell. The second rule is that when there is a space between elements, at least one cell exists in that space. Thus, the size of each cell is adjusted such that terminals that should not be connected to each other are not short-circuited. When the rules are not satisfied, management unit 102 (actually, CPU 622) returns to the first step to modify a mesh such that the size of each cell becomes smaller. At a third step, management unit 102 (actually, CPU 622) changes a net name of a terminal having arrangement information to a new net name. The new net name is formed by adding the arrangement information of the terminal to the original net name. The arrangement information represents a position of a terminal that couples an element to wiring. In the following, this new net name will be referred to as a "net name with arrangement information". Management unit 102 (actually, memory 624) associates a net name with arrangement information with actual arrangement information for registration. By changing a net name in this way, the wiring that has been handled by one net name collectively will be handled as a plurality of different wirings. The wiring handled as a plurality of different wirings is one having arrangement information (connected to actually-existing elements). The wiring connected to an element of an equivalent circuit is still handled by one net name. A voltage value, a current value, and the like can be analyzed for each actually-existing element. As a result, multiple pieces of circuit analysis information are generated from a piece of physical structure information. Then, management unit 102 (actually CPU 622 and memory 624) generates a plurality of circuit analysis subproblems from the circuit analysis information generated by the procedures described above. In addition, circuit/electromagnetic field analysis cooperative information is generated from the electromagnetic field analysis subproblem and the circuit analysis information. The process for generating the circuit analysis subproblem and the circuit/electromagnetic field analysis cooperative information corresponds to the processing at S220 to S234 as described later.

At S202, management unit 102 (actually CPU 622) distributes a plurality of circuit analysis subproblems generated by the processing at S200 to circuit analysis unit 106 (actually CPU 622) and the electromagnetic field analysis subproblem to electromagnetic field analysis unit 104 (actually CPU 622). At S204, management unit 102 (actually CPU 622) decides a synchronous step $\Delta t_{sync}$ of the electromagnetic field analysis subproblem and the circuit analysis subproblem. This synchronous step can be defined as $\Delta t_{sync} = k\Delta t_{em}$ (k=1, 2, ...). Depending on the required precision, k may assume various values. The smaller k is, the more precise result is obtained. Furthermore, a loop variable i is initialized to "0". The entire synchronous processing is performed at a time $i\Delta t_{sync}$ (i=0, 1, 2, ...).

At S206, management unit 102 (actually CPU 622) transmits a control signal to perform the circuit/electromagnetic field analysis cooperative processing by exchanging a current value and a voltage value at a terminal having arrangement information with a current value and a voltage value computed by the equivalent current source method or the equivalent voltage source method from the values of the electric field and magnetic field at time $i\Delta t_{sync}$ of the cell containing the terminal (actually, a step of assuming that a control signal is transmitted is carried out in CPU 622). Upon reception of the control signal from management unit 102, conversion unit 142 (actually CPU 622) transmits the current value and the voltage value converted by itself using the equivalent current source method and the equivalent voltage source method, to circuit analysis unit 106 (actually CPU 622) (actually, a step of assuming that a control signal is transmitted is carried out in CPU 622). Upon reception of the control signal from management unit 102, circuit analysis unit 106 calculates a current value and a voltage value at a terminal having arrangement information (in special circumstances, either one may be calculated. In the present embodiment, however, both are calculated) for transmission to conversion unit 142.

Figure 4:
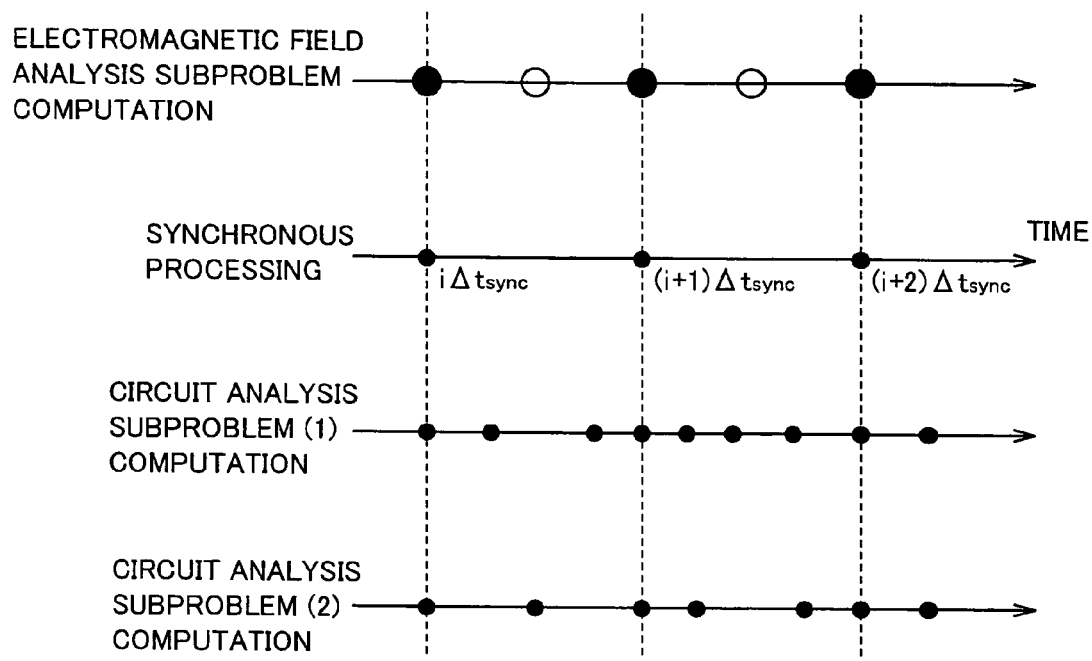
FIG. 4 illustrates the proceeding of computation processing for each subproblem in accordance with the embodiment of the present invention.

At S208, management unit 102 (actually CPU 622) transmits a control signal to electromagnetic field analysis unit 104 to perform the analysis computation of the electromagnetic field analysis subproblem from time $i\Delta t_{sync}$ to time $(i+1)\Delta t_{sync}$. Calculation unit 140 (actually CPU 622) carries out the analysis computation. Specifically, conversion unit 142 converts a current value and a voltage value as transmitted by circuit analysis unit 106 (in the present embodiment both will be transmitted although either one may be transmitted) at a position where wiring and an element are connected to each other, into the magnitude of an electric field and the magnitude of a magnetic field resulting from the current and the voltage in the element (if one of the current value and the voltage value is transmitted, the magnitude of an electric field or the magnitude of a magnetic field corresponding to that one is converted. In the present embodiment, however, conversion into both is performed). Calculation unit 140 uses the magnitude of an electric field and the magnitude of a magnetic field resulting from the current and the voltage in the element, the information representing the property, and the information representing the arrangement to calculate the magnitude of an electric field and the magnitude of a magnetic field at a predetermined point of time (in special circumstances, either one of them. In the present embodiment, however, both are transmitted) of each of the circuit board and the wiring, for each position of the circuit board and the wiring. When the magnitude of an electric field and the magnitude of a magnetic field are calculated, conversion unit 142 converts the magnitude of an electric field and the magnitude of a magnetic field calculated by calculation unit 140 into a current value and a voltage value at a position where the wiring and the element are connected to each other. Management unit 102 transmits a control signal to circuit analysis unit 106 to perform an analysis computation of each of a plurality of circuit analysis subproblems from time $i\Delta t_{sync}$ to time $(i+1)\Delta t_{sync}$. Circuit analysis unit 106 (actually CPU 622) carries out the analysis computation. In the present embodiment, circuit analysis unit 106 omits Newton iterative method for a solution of a circuit equation not including a nonlinear element, among the circuit equations. This can further increase the speed of analysis. FIG. 4 illustrates the proceeding of computation processing for each subproblem as performed in analysis apparatus 100 in the present embodiment. In this manner, except when the states at a common synchronous timing are analyzed, at which time a state is analyzed can be decided independently for each subproblem.

At S210, management unit 102 (actually CPU 622) determines whether or not $(i+1)\Delta t_{sync}$ exceeds a threshold value $t_{th}$ at a preset time. If it is determined that $(i+1)\Delta t_{sync}$ exceeds threshold value $t_{th}$ (YES at S210), the process will end. If not (NO at S210), the process goes to S212. At S212, management unit 102 (actually CPU 622) adds "1" to loop variable i.

Figure 5:
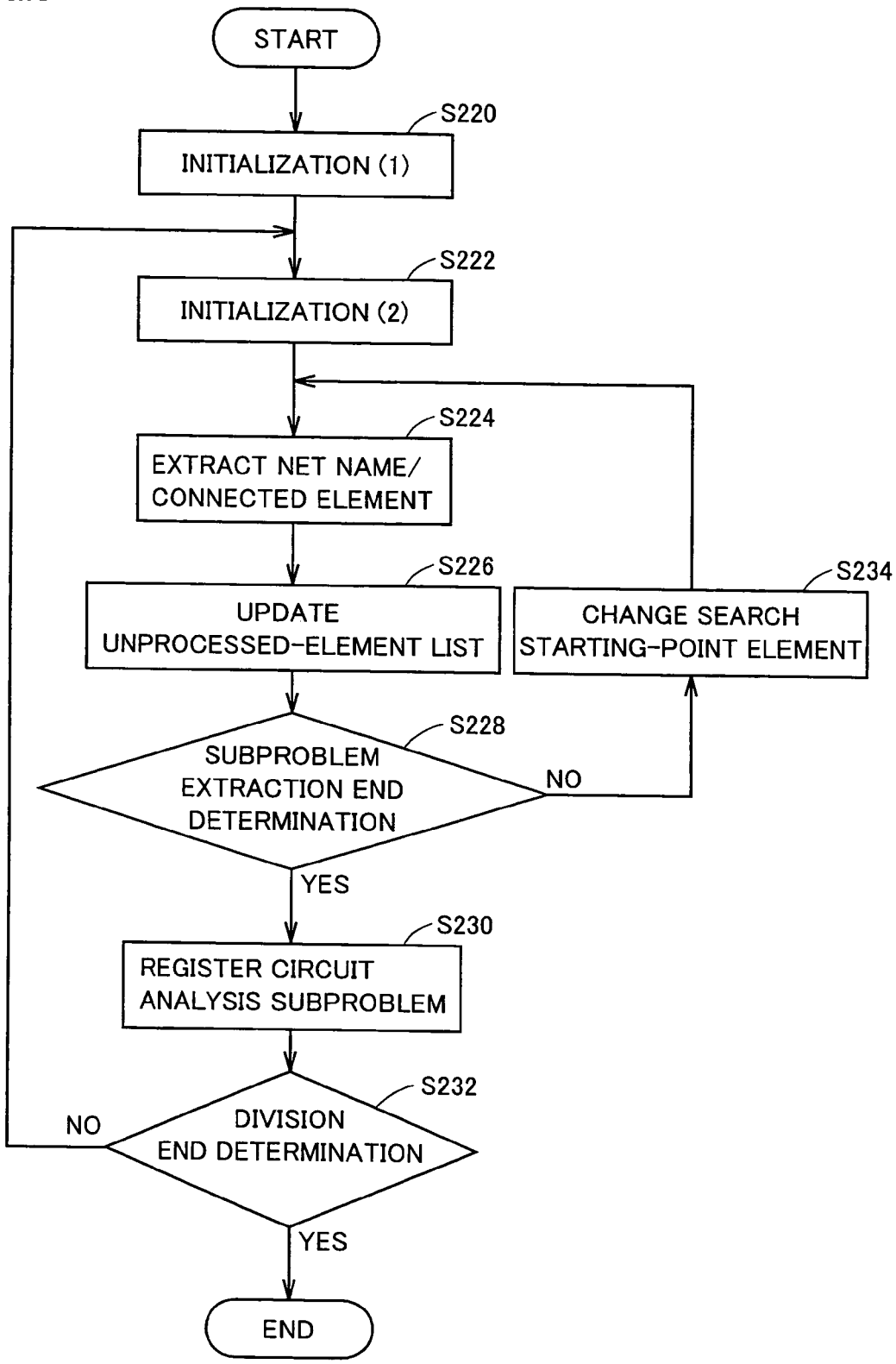
FIG. 5 is a flowchart showing a procedure of control of a process of generating a circuit analysis subproblem and a circuit/electromagnetic field analysis cooperative information in accordance with the embodiment of the present invention.

Referring to FIG. 5, the program executed in analysis apparatus 100 has the following control structure concerning the generation of a circuit analysis subproblem and circuit/electromagnetic field analysis cooperative information.

At S220, management unit 102 (actually memory 624) empties a subproblem list. Management unit 102 (actually memory 624) registers all elements in the unprocessed-element list. At S222, management unit 102 (actually memory 624) empties (initializes) the connected-element list and the cooperative net name list. Management unit 102 (actually CPU 622) retrieves one element from the unprocessed-element list and sets the retrieved element as a search starting-point element. Management unit 102 (actually CPU 622) registers the search starting-point element in the connected-element list. At S224, management unit 102 (actually CPU 622) extracts the net name of a terminal connected to each terminal of the search starting-point element. When the net name is extracted, management unit 102 (actually memory 624) registers in the connected-element list an element that has not been registered in the connected-element list among all the elements connected to the terminal corresponding to that net name. In addition, when the extracted net name is a net name with arrangement information and has not yet been registered in the cooperative net name list, management unit 102 (actually memory 624) registers the extracted net name in the cooperative net name list. At S226, management unit 102 (actually memory 624) deletes the search starting-point element from the unprocessed-element list.

At S228, management unit 102 (actually CPU 622) determines whether or not there exists any element that has been registered in both of the connected-element list and the unprocessed-element list. If it is determined that there exists no element that has been registered in both of the connected-element list and the unprocessed-element list (YES at S228), the process goes to S230. If not (NO at S228), the process goes to S234.

At S230, management unit 102 (actually memory 624) registers as a circuit analysis subproblem an element registered in the connected-element list, a net name connected to the terminal of the element registered in the connected-element list, and the electric characteristic of the element registered in the connected-element list. Management unit 102 (actually memory 624) copies the cooperative net name list and relates the copied list to the registered circuit analysis subproblem. These (the circuit analysis subproblem and the cooperative net name list related thereto) will be circuit/electromagnetic field analysis cooperative information to be used when each circuit analysis subproblem and each electromagnetic field analysis subproblem cooperate with each other.

At S232, management unit 102 (actually CPU 622) determines whether or not the unprocessed-element list is empty. If it is determined that the unprocessed-element list is empty (YES at S232), the process ends. If not (NO at S232), the process goes to S222.

At S234, management unit 102 (actually CPU 622) sets any one of the elements registered in both of the connected-element list and the unprocessed-element list as a search starting-point element.

Figure 6:
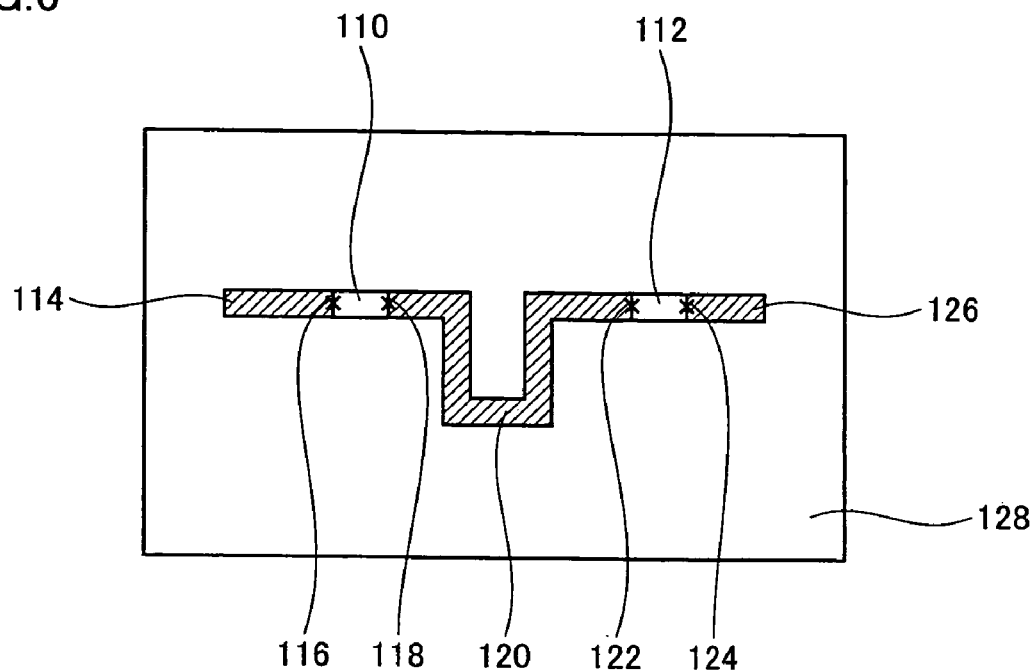
FIG. 6 is a circuit diagram of a circuit to be analyzed in the embodiment of the present invention.

Referring to FIG. 6, the operation of analysis apparatus 100 based on the following structure and flowchart will be described.

FIG. 6 is a circuit diagram of a circuit on which an element (1) 110 and an element (2) 112 are mounted on a printed circuit board 128. The circuit shown in FIG. 6 includes element (1) 110 provided as an ideal resistance element and element (2) 112 provided as a diode having a nonlinear characteristic, for which a transient response of current/voltage is obtained by the hybrid method. Element (1) 110 is connected to wiring (1) 114 at a node (1) 116 and to wiring (2) 120 at a node (2) 118. Similarly, element (2) 112 is connected to wiring (2) 120 at a node (3) 122 and to wiring (3) 126 at a node (4) 124.

Management unit 102 receives the physical structure information and the circuit analysis information of the circuit shown in FIG. 6. As described above, the physical structure information includes property information and arrangement information. The property information of the circuit shown in FIG. 6 includes the permittivity and magnetic permeability of element (1) 110, element (2) 112, wiring (1) 114, node (1) 116, node (2) 118, wiring (2) 120, node (3) 122, node (4) 124, wiring (3) 126, and printed circuit board 128. The arrangement information includes the coordinates of the vertexes of element (1) 110, element (2) 112, wiring (1) 114, wiring (2) 120, and wiring (3) 126, and printed circuit board 128, the coordinates of the bending point of wiring (2) 120, and the coordinates of the center of node (1) 116, node (2) 118, node (3) 122, and node (4) 124. As described above, the circuit analysis information is a set of information in which an element name, information representative of the electric characteristic of an element, and connection information of the element are associated with each other as a unit. The information representing the electric characteristic of an element in the present embodiment includes: an element type (resistor, capacitor, inductor, transistor model, and the like. The transistor model includes BSIM (Berkeley Short-Channel IGFET Model) and the like); and specific values such as resistance, capacitance, inductance, and a parameter of BSIM required for each element type. If the element type is a resistor, for example, "a value required for each element type" is resistance. The element type may be given implicitly with the initial of an element name. The connection information of the element is that a terminal present in the element and a net name of the connected wiring are associated with each other. In the present embodiment, the circuit analysis information corresponding to the circuit shown in FIG. 6 is represented in the format as shown in Table 1 below.

TABLE 1

|   | 1 | 2 | 3 | 4 |
|---|---|---|---|---|
| 1 | R1 | line1 | line2 | 50 |
| 2 | D1 | line2 | line3 | IS = $1.1 \times 10^{-14}$ |

The first row of Table 1 is the element definition information of element (1) 110. An element name "R1" is provided in the first column. Here, the initial "R" of the element name indicates that the element type is a resistor. A net name "line1" of wiring (1) 114 connected to terminal (1) is provided in the second column and a net name "line2" of wiring (2) 120 connected to terminal (2) is provided in the third column. Resistance 50 (ohms) of element (1) 110 is provided in the fourth column as a parameter in the case where the element type is a resistor.

The second row of Table 1 shows the element definition information of element (2) 112. Similar to the first row, an element name "D1" is provided in the first column. The initial "D" of the element name indicates that the element type is a diode. A net name "line2" of wiring (2) 120 connected to the anode-side terminal is provided in the second column, and a net name "line3" of wiring (3) 126 connected to the cathode-side terminal is provided in the third column. The fourth column specifies that a saturation current value IS is $1.1 \times 10^{-14}$ (amperes) as a parameter in the case where the element type is a diode.

Furthermore, since the net name "line2" connected to terminal (2) of element (1) 110 and the net name "line2" connected to the anode-side terminal of element (2) 112 are the same, it follows that terminal (2) of element (1) 110 is connected to the anode-side terminal of element (2) 112.

Upon reception of the physical structure information and the circuit analysis information, management unit 102 divides the electromagnetic field analysis region of the circuit to be subjected to the electromagnetic field analysis into cells. As a result, in the case of the circuit shown in FIG. 6, the mesh is formed in a grid. When the electromagnetic field analysis region is divided into cells, management unit 102 relates each cell to the property information of the substance present in each cell. By creating a relationship in this way, for one cell, a number unique to each cell, the coordinates of each cell, and the permittivity and magnetic permeability of the substance present in each cell are related to each other.

Upon completion of creation of a relationship, management unit 102 determines whether or not each cell satisfies the rules as described above. If the rules are not satisfied, management unit 102 modifies a mesh such that the size of each cell becomes smaller. Finally, the rules as described above are satisfied, so that management unit 102 changes the net name of the terminal having arrangement information to a net name with arrangement information.

In the circuit shown in FIG. 6, the replacement of each net name in Table 1 is performed as follows.

The net name "line1" connected to terminal (1) is replaced with a net name with arrangement information "line1_x(1)_y(1)_z(1)" additionally provided with arrangement information (x, y, z)=(1, 1, 1) of node (1) 116 to which terminal (1) is actually connected (terminal (1) is shown in the second column of the first row in Table 1). Here, management unit 102 relates the net name with arrangement information "line1_x(1)_y(1)_z(1)" generated by the replacement to the actual arrangement information (x, y, z)=(1, 1, 1) for registration. Every time a new net name with arrangement information is generated through such net name replacement processing, the processing of relating a net name with arrangement information to actual arrangement information for registration is performed. However, the description thereof will not be repeated hereinafter. Similarly, the net name "line2" connected to terminal (2) is replaced with a net name with arrangement information "line2_x(2)_y(1)_z(1)" additionally provided with arrangement information (x, y, z) =(2, 1, 1) of node (2) 118 to which the terminal is actually connected (terminal (2) is shown in the third column of the first row in Table 1).

The similar replacement is performed on the second row in Table 1, and Table 1 is finally replaced as Table 2.

TABLE 2

|   | 1  | 2                  | 3                  | 4                      |
|---|----|--------------------|--------------------|------------------------|
| 1 | R1 | line1_x(1)_y(1)_z(1) | line2_x(2)_y(1)_z(1) | 50                     |
| 2 | D1 | line2_x(3)_y(1)_z(1) | line3_x(4)_y(1)_z(1) | IS = 1.1 × $10^{-14}$ |

Since in Table 2 the net name "line2_x(2)_y(1)_z(1)" connected to terminal of element (1) 110 differs from the net name "line2_x(3)_y(1)_z(1)" connected to the anode-side terminal of element (2) 112, it follows that the connection between terminal (2) of element (1) 110 and the anode-side terminal of element (2) 112 as represented in Table 1 is cut off due to this replacement operation. When there exists a net name that is not the actually-existing wiring and is used to express an equivalent circuit of a certain element, although not existing in the example of FIG. 6, there is no arrangement information that can be related to such a net name. Therefore, the replacement of a net name does not take place and the circuit is not cut off.

Upon completion of the net name replacement processing, management unit 102 empties the subproblem list. Management unit 102 registers all the elements in the unprocessed-element list (S220). In the circuit illustrated in FIG. 6, two elements, that is, element (1) 110 of the element name "R1" and element (2) 112 of the element name "D1" are registered in the unprocessed-element list.

Upon completion of registration, management unit 102 empties (initializes) the connected-element list and the cooperative net name list. Management unit 102 retrieves one element from the unprocessed-element list and sets the retrieved element as a search starting-point element. In the circuit illustrated in FIG. 6, either of the two elements, for example, element (1) 110 of the element name "R1" is set as a search starting-point element. Thereafter, management unit 102 registers the search starting-point element in the connected-element list (S222). Then, management unit 102 extracts a net name connected to each terminal of the search starting-point element. In this example, referring to Table 2, two net names "line1_x(1)_y(1)_z(1)" and "line2_x(2)_y(1)_(1)" connected to each terminal of element (1) 110 of the element name "R1" are extracted.

Upon extraction of the net names, management unit 102 registers an element that has not been registered in the connected-element list, among all the elements whose net names are connected to the terminal, in the connected-element list. Accordingly, all the elements connected to each terminal of the search starting-point element with the same net name have been registered in the connected-element list. In the example of the circuit shown in FIG. 6, the element having a terminal connected to either of "line1_x(1)_y(1)_z(1)" and "line2_x(2)_y(1) _z(1)" is element (1) 110 of the element name "R1" only. This has already been registered in the connected-element list. Therefore, no new element will be registered in the connected-element list. Additionally, management unit 102 registers a net name that is a net name with arrangement information and has not yet been registered in the cooperative net name list, among the extracted net names, in the cooperative net name list (S224). In this example, two net names, that is, "line1_x(1)_y(1)_z(1)" and "line2_x(2)_y(1)_z(1)" are registered in the cooperative net name list. Upon completion of registration, management unit 102 deletes the search starting-point element (element (1) 110 of the element name "R1") from the unprocessed-element list (S206). Upon deletion of the search starting-point element, management unit 102 determines whether or not there is any element that is registered in both of the connected-element list and the unprocessed-element list (S228). In this case, the connected-element list has one element (1) 110 of the element name "R1" registered therein and the unprocessed-element list has one element (2) 112 of the element name "D1" registered therein (YES at S228), so that management unit 102 registers as a circuit analysis subproblem an element registered in the connected-element list, a net name connected to each terminal of the connected-element list, and information representing the electric characteristic of the element registered in the connected-element list. Management unit 102 copies the cooperative net name list and relates the copied list to the circuit analysis subproblem (S230). In this example, the circuit represented in Table 3 is related to the copy of the cooperative net name list "line1_x(1)_y(1)_z(1)" and "line2_x(2)_y(1)_z(1)".

TABLE 3

|   | 1  | 2                  | 3                  | 4  |
|---|----|--------------------|--------------------|----|
| 1 | R1 | line1_x(1)_y(1)_z(1) | line2_x(2)_y(1)_z(1) | 50 |

TABLE 4

|   | 1  | 2                  | 3                  | 4                      |
|---|----|--------------------|--------------------|------------------------|
| 1 | D1 | line2_x(3)_y(1)_z(1) | line3_x(4)_y(1)_z(1) | IS = 1.1 × $10^{-14}$ |

Upon completion of creation of a relationship, management unit 102 determines whether or not the unprocessed-element list is empty (S232). Since element (2) 112 of the element name "D1" is still registered (NO at S232), the processing at S222 to S232 is repeated. As a result, two circuit analysis subproblems in Table 3 and Table 4, and the copy of the cooperative net name list "line1_x(1)_y(1)_z(1)", "line2_x(2)_y(1)_z(1)", and "line2_x(3)_y(1)_z(1)", "line3_x(4)_y(1)_z(1)" are generated in such a manner that they are related to each other.

When the unprocessed-element list finally becomes empty (the circuit analysis subproblems for element (1) 110 and element (2) 112 are generated) (YES at S232), management unit 102 distributes the circuit analysis subproblems for element (1) 110 and element (2) 112 to circuit analysis unit 106 and the electromagnetic field analysis subproblems to electromagnetic field analysis unit 104 (S202). Upon distribution of the subproblems, management unit 102 decides a synchronous step $\Delta t_{sync}$ of the electromagnetic field analysis subproblem and the circuit analysis subproblem. In addition, management unit 102 initializes loop variable i to "0" (S204). Upon initialization of the variable, management unit 102 transmits a control signal. Upon reception of the control signal from management unit 102, conversion unit 142 transmits a current value and a voltage value computed by the equivalent current source method and the equivalent voltage source method to circuit analysis unit 106. Here, a current value and a voltage value are not computed for a cell in which element (1) 110 and element (2) 112 exists. The current values and the voltage values for node (1) 116, node (2) 118, node (3) 122, and node (4) 124 are transmitted to circuit analysis unit 106. Upon reception of the control signal from management unit 102, circuit analysis unit 106 transmits the current value and the voltage value at a terminal having arrangement information to conversion unit 142 (S206).

Figure 7:
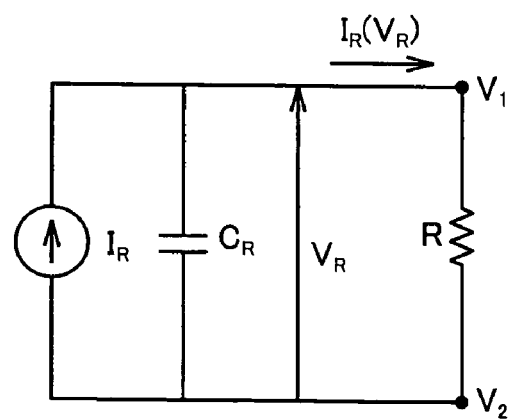
FIG. 7 is an equivalent circuit diagram of an element (1) analyzed in the embodiment of the present invention.
Figure 8:
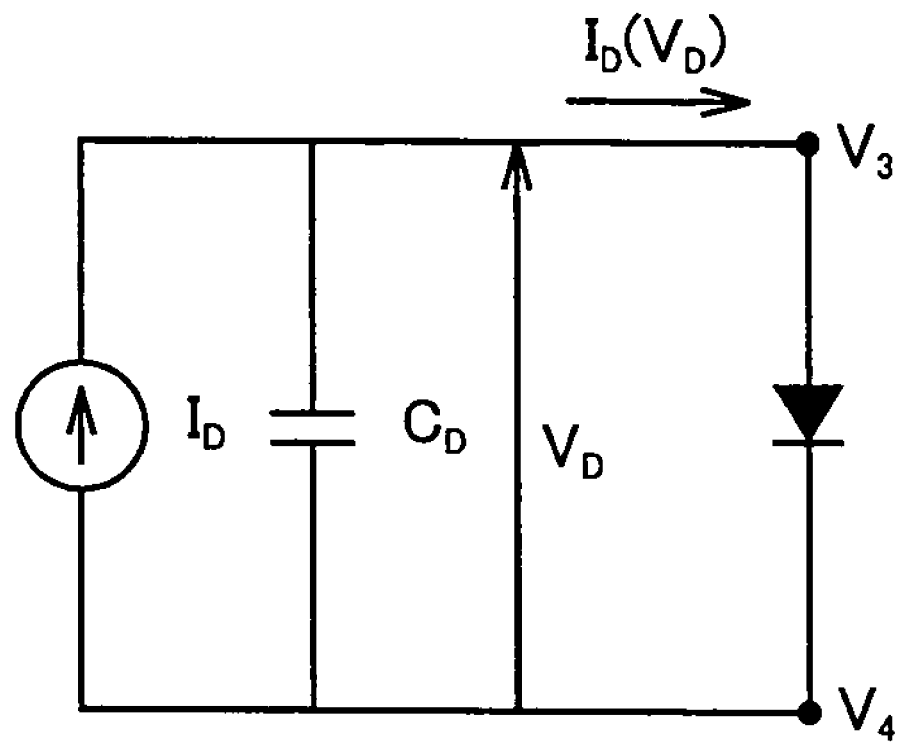
FIG. 8 is an equivalent circuit diagram of an element (2) analyzed in the embodiment of the present invention.
Figure 9:
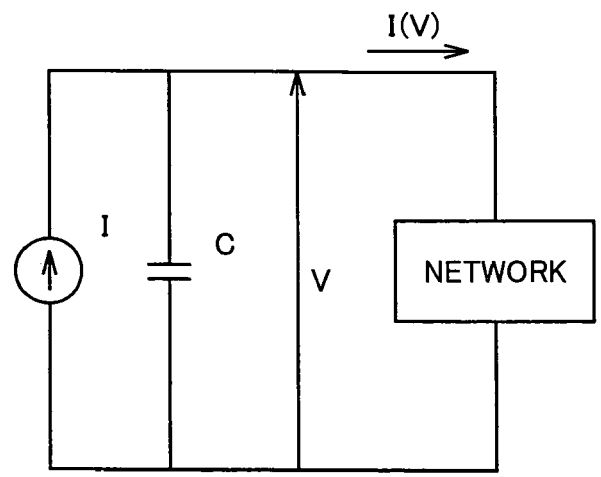
FIG. 9 is a diagram illustrating an equivalent circuit of a process in which FDTD method is combined with a circuit simulator in accordance with a conventional example.
Figure 10:
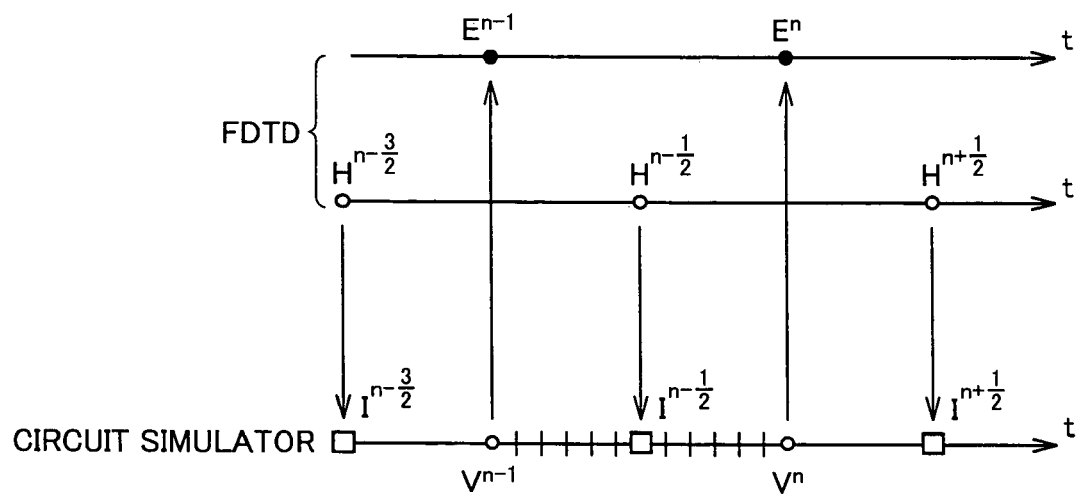
FIG. 10 is a diagram showing a flow of data in FDTD method and a circuit simulator in time sequence in accordance with a conventional example.
Figure 11:
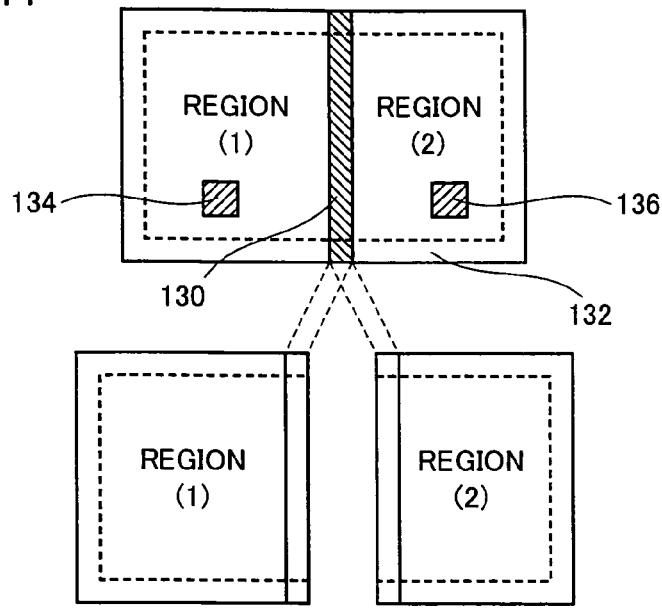
FIG. 11 is a diagram illustrating distribution of processing for each information processor in accordance with a conventional example.
Figure 12:
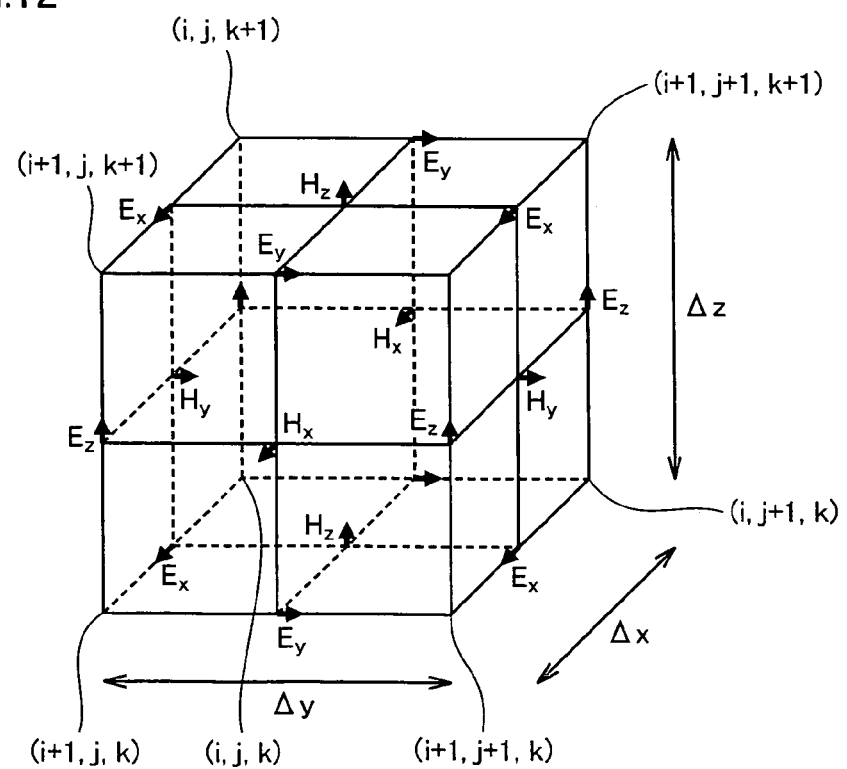
FIG. 12 is a diagram illustrating an analysis method in accordance with a conventional example.
Figure 13:
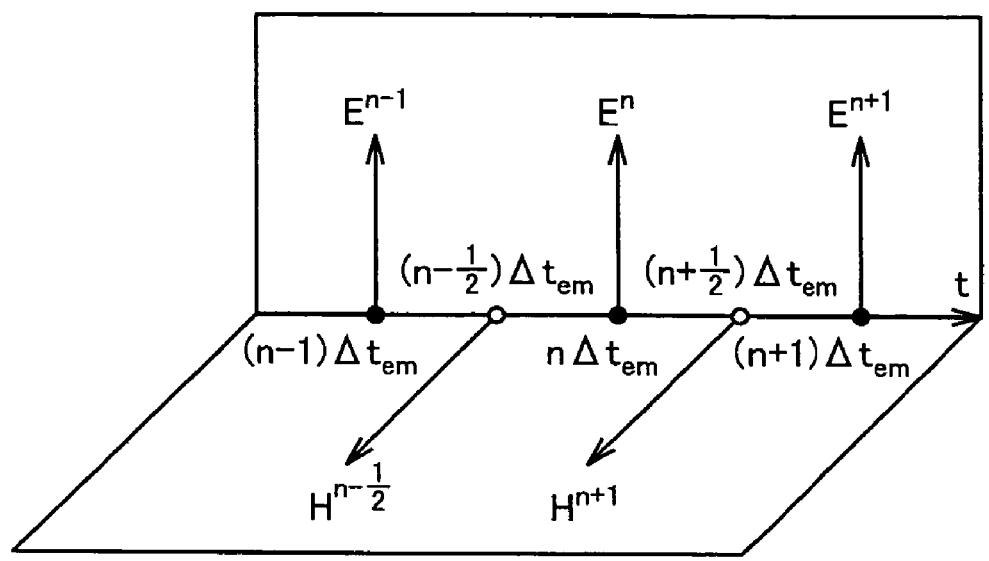
FIG. 13 is a diagram showing an order in which electric field intensity and magnetic field intensity are calculated in association with passage of time in accordance with a conventional example.

Data passing among calculation unit 140, conversion unit 142, and circuit analysis unit 106 in the equivalent current source method will now be described. Assume that electric field intensity $E^{n-1}$ at a time $(n-1)\Delta t_{em}$ and magnetic field intensity $H^{n-3/2}$ at a time $(n-3/2)\Delta t_{em}$ are known. Magnetic field intensity $H^{n-1/2}$ at a time $(n-1/2)\Delta t_{em}$ can be found by substituting $E^{n-1}$, $H^{n-3/2}$ into formula (4). However, electric field intensity $E^n$ at time $n\Delta t_{em}$ is computed differently between a cell including an element and a cell including no element. In the case of a cell including no element, electric field intensity $E^n$ is calculated by substituting $E^{n-1}$ and $H^{n-1/2}$ into formula (3). In the case of a cell including an element, electric field intensity $E^n$ is calculated by a circuit analysis of circuit analysis unit 106. Circuit analysis unit 106 calculates a voltage value $V^n$ of an element at time $n\Delta t_{em}$ by performing a circuit simulation from time $(n-1)\Delta t_{em}$ to $n\Delta t_{em}$ (the time intervals are set finely enough), where, in the equivalent circuit in FIG. 7, the initial voltage value of a capacitor is $V^{n-1}=E_z^{n-1}\Delta z$, and the equivalent current source value is $I=A\cdot\nabla\times H^{n-1/2}$. The voltage value $V^n$ of an element at time $n\Delta t_{em}$ is converted by conversion unit 142 to electric field intensity $E_z^n=V^n/\Delta z$ of the cell including an element. The converted electric field intensity $E_z^n$ is passed to calculation unit 140.

Also in the equivalent voltage source method, an equivalent voltage source value is similarly obtained from an electric field obtained by FDTD method, and a current value at a time at which a magnetic field is obtained by FDTD method is analyzed by circuit analysis unit 106 and is then converted into a magnetic field by conversion unit 142 to be passed to calculation unit 140 for further analysis. Accordingly, calculation unit 140 calculates the magnitude of at least any one of an electric field and a magnetic field by Finite Difference Time Domain method (in the present embodiment, FDTD method).

When a current value and a voltage value are transmitted, management unit 102 transmits a control signal to electromagnetic field analysis unit 104 to perform an analysis computation of an electromagnetic field analysis subproblem from time $i\Delta t_{sync}$ to time $(i+1)\Delta t_{sync}$. Management unit 102 transmits a control signal to circuit analysis unit 106 to perform respective analysis computations of a plurality of circuit analysis subproblems from time $i\Delta t_{sync}$ to time $(i+1)\Delta t_{sync}$ (S208).

The voltage-current characteristic of the diode of element (2) 112 is represented by formula (6).

$$I_D(V_D) = I_0\left\{\exp\left(\frac{qV_D}{kT}\right) - 1\right\} \quad (6)$$

where $I_p$ is a current value, $V_p$ is a voltage value, q is elementary charge, and T is an absolute temperature.

The following simultaneous differential equations are obtained by circuit analysis unit 106 adopting Modified Nodal Analysis for node (1) 116, node (2) 118, node (3) 122, node (4) 124.

$$\begin{cases} C_R \dfrac{d(V_1-V_2)}{dt} + \dfrac{V_1-V_2}{R} = I_R \\ -C_R \dfrac{d(V_1-V_2)}{dt} - \dfrac{V_1-V_2}{R} = -I_R \\ C_D \dfrac{d(V_3-V_4)}{dt} + I_0\left\{\exp\left(\dfrac{q(V_3-V_4)}{kT}\right)-1\right\} = I_D \\ -C_D \dfrac{d(V_3-V_4)}{dt} - I_0\left\{\exp\left(\dfrac{q(V_3-V_4)}{kT}\right)-1\right\} = -I_D \end{cases} \quad (7)$$

where $V_n$ (n=1, 2, 3, 4) is a voltage value, $I_D$ and $I_R$ are electrostatic capacity, $C_D$ and $C_R$ are electrostatic capacity, and R is resistance.

Here, in formula (7), the first equation and the second equation as well as the third equation and the fourth equation are the same except that the signs are different. $V_2$ and $V_4$ may be treated as a constant since they are potentials obtained by differentiating an electric field from a cell serving as a reference point of voltage in FDTD method. The circuit simulator may send a voltage difference that occurs at an element end to FDTD method, so that formula (7) can be rewritten to formula (8) given that $V_1-V_2=V_R$, $V_3-V_4=V_D$.

$$\begin{cases} C_R \dfrac{dV_R}{dt} + \dfrac{V_R}{R} = I_R \\ C_D \dfrac{dV_D}{dt} + I_0\left\{\exp\left(\dfrac{qV_D}{kT}\right)-1\right\} = I_D \end{cases} \quad (8)$$

Accordingly, as the first equation and the second equation in formula (8) are variables independent of each other, the equations can be solved separately. More specifically, circuit analysis unit 106 uses at least any one of the current value and the voltage value converted by conversion unit 142 from the magnitude of an electric field and the magnitude of a magnetic field calculated by calculation unit 140, any one of multiple pieces of information divided by management unit 102, and information representing the electric characteristic to calculate at least any one of the current value and the voltage value at a predetermined point of time for the element represented by any one of multiple pieces of information divided by management unit 102. Furthermore, circuit analysis unit 106 calculates at least any one of a current value and a voltage value by Modified Nodal Analysis. In a circuit that does not include a nonlinear element such as the first equation of formula (8), the equation can be solved without using Newton iterative method. When the first equation and the second equation in formula (8) are solved simultaneously, Newton iterative method is adopted to the first equation to which essentially Newton iterative method needs not be adopted, since the second equation includes a nonlinear characteristic term. The computational cost is thus increased. When those equations are separately solved, Newton iterative method is adopted only to the second equation, which allows a further reduction in computational cost as compared with the case where the equations are solved simultaneously. Circuit analysis unit 106 solves the equations separately as an analysis computation. Therefore, circuit analysis unit 106 preliminarily determines whether or not Newton iterative method is used for each of a plurality of elements. After the determination, circuit analysis unit 106 calculates at least any one of a current value and a voltage value using Newton iterative method for the element that is determined by circuit analysis unit 106 itself to use Newton iterative method. The reason why the first equation and the second equation in formula (8) become variables independent of each other is as follows: even if node (2) 118 and node (3) 122 are linked through wiring (2) 120 in the circuit, they can be treated as different variables in the circuit analysis by analyzing a part of wiring (2) 120 by FDTD method.

Upon transmission of a control signal, management unit 102 determines whether or not $(i+1)\Delta t_{sync}$ exceeds threshold value $t_{th}$ at a preset time (S210). Since initially $(i+1)\Delta t_{sync}$ does not exceed threshold value $t_{th}$ (NO at S210), management unit 102 adds "1" to loop variable i (S212). Upon addition of "1" to the variable, after the processing at S206 to S212 is repeated, management unit 102 determines again whether or not $(i+1)\Delta t_{sync}$ exceeds threshold value $t_{th}$ at a preset time (S210). Since finally $(i+1)\Delta t_{sync}$ exceeds threshold value $t_{th}$ (YES at S210), management unit 102 allows electromagnetic field analysis unit 104 and circuit analysis unit 106 (in this case, actually CPU 622 and display 610) to output the result of the analysis computation, and the process then ends.

As described above, in a circuit/electromagnetic field analysis cooperative analysis for obtaining the behaviors of a printed circuit board and components mounted thereon, the analysis apparatus in accordance with the present embodiment efficiently divides an analysis problem for a complicated circuit into an electromagnetic field analysis subproblem and a plurality of circuit analysis subproblems, which can be computed independently and simply, from circuit analysis information and the like for performing a circuit analysis after circuit design. Since the analysis problem is divided, the number of circuit simultaneous equations can be reduced. The reduced number of simultaneous equations allows a reduction in analysis time required for circuit analysis. The analysis apparatus in accordance with the present embodiment exchanges information of subproblems with each other at a common synchronous timing. During intervals between synchronous timings, the analysis apparatus in accordance with the present embodiment independently performs the computation processing of each subproblem. As described above, generally, when linear simultaneous equations with n unknowns are solved by a solution such as Gaussian elimination, the complexity is approximately $n^3/3 + O(n^2)$. Although the second term varies depending on a solution, the first term is dominant in the computational cost when n is large. Therefore, here only the first term is considered, assuming $n^3/3$. Supposing that a circuit equation can be divided into two, when those divided circuit equations are sequentially solved by one information processor, the complexity is approximately $2 \cdot (n/2)^3/3 = n^3/12$. The complexity can be reduced to about one quarter as compared with the case where the circuit equation is solved without being divided. Moreover, the divided circuit equations can be computed in parallel using a plurality of information processors. Therefore, the analysis apparatus in accordance with the present embodiment can analyze a circuit at high speed. As a result, it is possible to provide an analysis apparatus capable of analyzing a circuit at high speed even when the number of elements handled in circuit analysis increases.

It is noted that analysis apparatus 100 may be configured such that management unit 102, electromagnetic field analysis unit 104, and circuit analysis unit 106 each include at least one or more separate computers. In this case, the computers are connected to each other over a network. The analyzed information is exchanged via communications over the network. An example of a part of such a configuration will be described. A first computer and a second computer each operate as electromagnetic field analysis unit 104. The first computer and the second computer calculate the strength of electric field and the strength of magnetic field at a computational time by the following procedure. In the first procedure, the strength of an electric field in a overlap region of which electric field or magnetic field is analyzed is calculated at a prescribed computational time. In the second procedure, the first computer transmits the strength of an electric field in the overlap region to the second computer. In the second procedure, in parallel with the transmission, the second computer calculates the strength of an electric field and the strength of a magnetic field in a region excluding the overlap region among the divided regions, at a computational time.

Alternatively, when analysis apparatus 100 is configured with a plurality of computers, a computer responsible for both the processing as electromagnetic field analysis unit 104 and the processing as circuit analysis unit 106 may be included. Accordingly, the information of circuit/electromagnetic field analysis cooperative analysis can be exchanged without a network. A program for implementing the processing serving as both the processing as electromagnetic field analysis unit 104 and the processing as circuit analysis unit 106 is read to cause the computer to carry out both of the processing as electromagnetic field analysis unit 104 and the processing as circuit analysis unit 106. The computer responsible for both of the processing as electromagnetic field analysis unit 104 and the processing as circuit analysis unit 106 may be a computer that performs a behavior computation for a simple circuit as circuit analysis unit 106. Therefore, a simple circuit can be analyzed without cooperation with a computer that computes a behavior of a complicated circuit.

Alternatively, a computer forming circuit analysis unit 106 may include a plurality of computers respectively computing a plurality of circuit analysis subproblems. For example, two computers may solve the first equation and the second equation in formula (8) respectively at S208 described above. Accordingly, the number of circuit simultaneous equations undertaken by each computer is reduced as compared with the circuit equations for the entire region. Therefore, considering the complexity required for Gaussian elimination, the complexity is less likely to increase even if the circuit scale is increased.

When one computer forming circuit analysis unit 106 computes a plurality of circuit analysis subproblems, the computer may store the values resulting from several circuit analyses in an external recording device (nonvolatile memory, for example) and exchange those values to compute any given number of circuit analyses in parallel.

Alternatively, conversion unit 142 may be included in circuit analysis unit 106. Conversion unit 142 may be a circuit independent of electromagnetic field analysis unit 104 and circuit analysis unit 106.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An analysis apparatus comprising:
a reception unit for receiving information representing a property of a material forming a circuit board and wiring, information representing an arrangement of said material, information representing electric characteristics of a plurality of elements, and information representing said plurality of elements and said wiring linking said plurality of elements to each other;
a first calculation unit for calculating a magnitude of an electric field and a magnitude of a magnetic field at a plurality of predetermined points of time for each of said circuit board and said wiring using a magnitude of an electric field and a magnitude of a magnetic field resulting from current and voltage in said element, said information representing a property, and said information representing an arrangement;
a conversion unit for mutually converting a magnitude of an electric field and a magnitude of a magnetic field, and a current value and a voltage value;
a division unit for dividing said information representing wiring linking a plurality of elements to each other into multiple pieces of element definition information representing wiring to which each said element is linked;
a second calculation unit for calculating a current value and a voltage value at said plurality of predetermined points of time for an element represented by each of multiple pieces of element definition information divided by said division unit, using a current value and a voltage value converted by said conversion unit from a magnitude of an electric field and a magnitude of a magnetic field calculated by said first calculation unit, multiple pieces of element definition information divided by said division unit, and said information representing electric characteristics; and
an output unit for outputting (i) the magnitude of the electric field and the magnitude of the magnetic field calculated by the first calculation unit, (ii) the current value and the voltage value calculated by the second calculation unit, or (iii) the magnitude of the electric field and the magnitude of the magnetic field calculated by the first calculation unit as well as the current value and the voltage value calculated by the second calculation unit.

2. The analysis apparatus according to claim 1, wherein said second calculation unit includes a part calculating said current value and said voltage value by Modified Nodal Analysis.

3. The analysis apparatus according to claim 1, wherein said division unit includes a part dividing said information representing wiring linking a plurality of elements to each other into said multiple pieces of element definition information such that said multiple pieces of element definition information vary for each said element.

4. The analysis apparatus according to claim 3, wherein said part dividing said information representing wiring linking a plurality of elements to each other into said multiple pieces of element definition information includes a part dividing said information representing wiring linking a plurality of elements to each other into said multiple pieces of element definition information such that said information representing wiring linking a plurality of elements to each other includes information representing a position of said wiring whereby said information representing wiring linking a plurality of elements to each other varies for each said element.

5. The analysis apparatus according to claim 1, wherein said first calculation unit includes a part calculating said magnitude of an electric field and said magnitude of a magnetic field by Finite Difference Time Domain method.

6. The analysis apparatus according to claim 1, wherein said second calculation unit includes:
a determination unit determining whether or not Newton iterative method is used for an element represented by each of said multiple pieces of element definition information; and
a part calculating said current value and said voltage value using said Newton iterative method for an element that is determined by said determination unit to use said Newton iterative method.

7. The analysis apparatus according to claim 1, wherein said first calculation unit and said second calculation unit each include at least one separate computer.

8. An analysis program product for causing a computer to execute:
a reception step of receiving information representing a property of a material forming a circuit board and wiring, information representing an arrangement of said material, information representing electric characteristics of a plurality of elements, and information representing said plurality of elements and said wiring linking said plurality of elements to each other;
a first calculation step of calculating a magnitude of an electric field and a magnitude of a magnetic field at a plurality of predetermined points of time for each of said circuit board and said wiring using a magnitude of an electric field and a magnitude of a magnetic field resulting from current and voltage in said element, said information representing a property, and said information representing an arrangement;
a conversion step of mutually converting a magnitude of an electric field and a magnitude of a magnetic field, and a current value and a voltage value;
a division step of dividing said information representing wiring linking a plurality of elements to each other into multiple pieces of element definition information representing wiring to which each said element is linked;
a second calculation step of calculating a current value and a voltage value at said plurality of predetermined points of time for an element represented by each of multiple pieces of element definition information divided at said division step, using a current value and a voltage value converted at said conversion step from a magnitude of an electric field and a magnitude of a magnetic field calculated at said first calculation step, multiple pieces of element definition information divided at said division step, and said information representing electric characteristics; and
an outputting step of outputting (i) the magnitude of the electric field and the magnitude of the magnetic field calculated by the first calculation unit, (ii) the current value and the voltage value calculated by the second calculation unit, or (iii) the magnitude of the electric field and the magnitude of the magnetic field calculated by the first calculation unit as well as the current value and the voltage value calculated by the second calculation unit.

9. A computer readable recording medium having an analysis program recorded thereon for causing a computer to execute:
a reception step of receiving information representing a property of a material forming a circuit board and wiring, information representing an arrangement of said material, information representing electric characteristics of a plurality of elements, and information representing said plurality of elements and said wiring linking said plurality of elements to each other;

a first calculation step of calculating a magnitude of an electric field and a magnitude of a magnetic field at a plurality of predetermined points of time for each of said circuit board and said wiring using a magnitude of an electric field and a magnitude of a magnetic field resulting from current and voltage in said element, said information representing a property, and said information representing an arrangement;

a conversion step of mutually converting a magnitude of an electric field and a magnitude of a magnetic field, and a current value and a voltage value;

a division step of dividing said information representing wiring linking a plurality of elements to each other into multiple pieces of element definition information representing wiring to which each said element is linked;

a second calculation step of calculating a current value and a voltage value at said plurality of predetermined points of time for an element represented by each of multiple pieces of element definition information divided at said division step, using a current value and a voltage value converted at said conversion step from a magnitude of an electric field and a magnitude of a magnetic field calculated at said first calculation step, multiple pieces of element definition information divided at said division step, and said information representing electric characteristic; and an outputting step of outputting (i) the magnitude of the electric field and the magnitude of the magnetic field calculated by the first calculation unit, (ii) the current value and the voltage value calculated by the second calculation unit, or (iii) the magnitude of the electric field and the magnitude of the magnetic field calculated by the first calculation unit as well as the current value and the voltage value calculated by the second calculation unit.

* * * * *